United States Patent [19]

Nishida et al.

[11] Patent Number: 5,098,850

[45] Date of Patent: Mar. 24, 1992

[54] PROCESS FOR PRODUCING SUBSTRATE FOR SELECTIVE CRYSTAL GROWTH, SELECTIVE CRYSTAL GROWTH PROCESS AND PROCESS FOR PRODUCING SOLAR BATTERY BY USE OF THEM

[75] Inventors: Shoji Nishida, Nagahama; Takao Yonehara, Atsugi, both of Japan

[73] Assignee: Canon Kabushiki Kaisha, Tokyo, Japan

[21] Appl. No.: 537,818

[22] Filed: Jun. 14, 1990

[30] Foreign Application Priority Data

Jun. 16, 1989 [JP] Japan .................................. 1-152410

[51] Int. Cl.⁵ .................. H01L 31/18; H01L 31/0368; H01L 31/0392
[52] U.S. Cl. ........................ 437/4; 136/258; 156/612; 156/627; 148/DIG. 122; 437/89; 437/99; 437/113; 437/170; 437/235; 437/946; 437/967
[58] Field of Search ................ 437/4, 89–92, 437/99, 109, 113, 170, 172, 225, 235, 238, 926, 946, 967; 148/DIG. 21, DIG. 122, DIG. 135, DIG. 153; 156/627, 662, 612; 136/258 PC

[56] References Cited

U.S. PATENT DOCUMENTS

| | | | |
|---|---|---|---|
| 4,243,432 | 1/1981 | Jordan et al. | 136/244 |
| 4,400,409 | 8/1983 | Izu et al. | 427/39 |
| 4,661,370 | 4/1987 | Tarrant | 427/37 |
| 4,800,527 | 1/1989 | Ozaki et al. | 365/182 |

FOREIGN PATENT DOCUMENTS

| | | |
|---|---|---|
| 0244081 | 11/1987 | European Pat. Off. |
| 0276961 | 8/1988 | European Pat. Off. |
| 1-51671 | 2/1989 | Japan ........................ 136/258 PC |

Primary Examiner—Aaron Weisstuch
Attorney, Agent, or Firm—Fitzpatrick, Cella, Harper & Scinto

[57] ABSTRACT

A process for producing a substrate for selective crystal growth, which comprises subjecting a substrate having a layer comprising a first material having higher nucleation density and a layer comprising a second material having lower nucleation density than the first material laminated thereon to application of an electrical field concentrated at a desired region of the layer comprising the second material, thereby removing the region whereby the layer comprising the first material is exposed.

22 Claims, 3 Drawing Sheets

PROCESS FOR PRODUCING SUBSTRATE FOR SELECTIVE CRYSTAL GROWTH, SELECTIVE CRYSTAL GROWTH PROCESS AND PROCESS FOR PRODUCING SOLAR BATTERY BY USE OF THEM

BACKGROUND OF THE INVENTION

1. Field of the Invention

This invention relates to a process for producing a substrate for selective crystal growth, a process for selective crystal growth and a process for producing a solar battery by using such processes. Particularly, it relates to a process which can continuously perform selective crystal growth at low cost, a process for producing a substrate for selective crystal growth therefor and a process capable of continuously producing a solar battery with good energy conversion efficiency by use of the above selective crystal growth process.

2. Related Background Art

Solar batteries have been utilized as driving energy sources in various instruments.

A solar battery has a functional portion in which a pn junction or a pin junction is employed. Silicon has been generally employed as the semiconductor constituting these pn and pin junctions. With respect to efficiency in converting photoenergy to electromotive force, it is preferable to use single crystal silicon, but with respect to enlargement of area and reduction in cost, amorphous silicon has been deemed to be advantageous.

In recent years, for the purpose of low cost comparable with amorphous silicon and high energy conversion efficiency comparable with single crystal silicon, investigations have been made about use of a polycrystalline silicon. However, according to the method proposed in the prior art, a polycrystal shaped in a mass was sliced into a plate and used, and therefore it was difficult to make the thickness 0.3 mm or less, whereby the thickness cannot be made to a thickness thin enough to permit sufficient absorption of light possible. Thus, effective utilization of the material has not been possible. In short, for enhancing efficiency and reducing production cost, it is necessary to significantly reduce the thickness.

Accordingly, attempts have been made to form a thin film of a polycrystalline silicon by utilizing the thin film formation techniques such as chemical vapor deposition (CVD), etc., but the crystal grain size obtained by such method is at most a few microns, and the energy conversion efficiency is even lower when compared with the chip sliced from a mass of polycrystalline silicon.

Also, an attempt has been made to enlarge the crystal grain size by irradiating a polycrystalline silicon thin film, formed by the above-mentioned CVD method, with a laser beam, thereby effecting melting and recrystallizing the thin film. However, cost reduction was not satisfactory and production was unstable.

Such situation is not limited to silicon, but is the same with compound semiconductors.

On the other hand, as a process aiming at improvement of bulk productivity of a solar battery, there is the process disclosed in U.S. Pat. No. 4,400,409. This process comprises feeding a flexible substrate wound up on a pay out reel from the pay out reel, then conveying the substrate to a film forming chamber, performing film formation treatment in the film forming chamber and then winding up the film on a take up reel. Further, U.S. Pat. No. 4,400,409 discloses lamination of semiconductor layers different from each other by providing a plural number of film forming chambers. However, even when a solar battery was produced by this process, a polycrystalline film with a large crystal grain size as described above was not obtained, and satisfactory conversion efficiency was not obtained.

On the other hand, as a process for producing a solar battery of thin type, having sufficiently large crystal grain size and good energy conversion efficiency, there is the process disclosed in EP Laid-open Patent Application No. 276961A2. This application discloses "A process for preparing a solar battery comprising: effecting formation of a first semiconductor layer of a first conduction type on the surface of a substrate including the step of adding to the surface of said substrate a material different than the material constituting the surface of said substrate which is sufficiently greater in nucleation density (ND) than the material constituting the surface of said substrate in a sufficiently small area such that crystal growing occurs from only a single nucleus to thereby form a nucleation surface, applying crystal forming treatment to said substrate to form a single nucleus on the nucleation surface and growing a single crystal from the single nucleus; and then forming a second semiconductor layer of a second conduction type above said first semiconductor layer."

This process utilizes the selective single crystal growth method. The selective single crystal growth method is a method in which a crystal is permitted to grow selectively by utilizing the difference in factors between the materials which influence nucleation during a thin film formation process, such as surface energy, attachment coefficient, release coefficient, surface diffusion speed, etc. More specifically, it is a method in which a single crystal is permitted to grow on the base of a nucleation surface provided on a nonnucleation surface (surface with smaller nucleation density) having a sufficiently larger nucleation density than said nonnucleation surface and having a sufficiently fine surface area so as to form only a nucleus from which a single crystal is grown. In this method no crystal growth occurs from the nonnucleation surface, but growth of a single crystal occurs only from the nucleation surface. However, even if this method is utilized, there remain points to be improved for producing a solar battery of large area with good production efficiency.

In the process disclosed in the above-mentioned EP Laid-open Patent Application No. 276961A2, conventional patterning by using a generally known photolithographic method of the prior art is practiced in providing a different kind of material which becomes the nucleation surface on the substrate surface.

Such photolithographic step is done by batch treatment. For this reason, for obtaining a solar battery of high performance by use of a large gain size crystal, a plurality of steps were performed concurrently and continuously, whereby it has been difficult to improve production efficiency.

Thus, by use of any one of the processes as described above, it is extremely difficult under the present situation to produce a solar battery by use of a large grain size crystal capable of giving good conversion efficiency with good production efficiency.

SUMMARY OF THE INVENTION

The present invention, as the result of intensive study by the present inventors in view of the prior art as described above, is based on the finding obtained that a substrate for selective crystal growth can be formed by applying a concentrated electrical field on a desired region of a substrate to thereby expose a nucleation surface from a nonnucleation surface without directly using photolithography.

A main object of the present invention is to provide a selective crystal growth process which continuously performs the steps of providing a nonnucleation surface and a nucleation surface on a substrate without directly using photolithography, a process for producing the substrate to be used for said process, and a process for producing a solar battery having good characteristics with sufficient bulk productivity by using the above crystal growth process.

Another object of the present invention is to provide a process for producing a substrate for selective crystal growth, which comprises subjecting a substrate having a layer comprising a first material having higher nucleation density and a layer comprising a second material having lower nucleation density than said first material laminated thereon to application of an electrical field concentrated at a desired region of the layer comprising said second material, thereby removing said region to expose the layer comprising said first material.

Still another object of the present invention is to provide a process for selective crystal growth, which comprises subjecting a substrate having a layer comprising a first material having higher nucleation density and a layer comprising a second material having lower nucleation density than said first material laminated thereon to application of an electrical field concentrated at a desired region of the layer comprising said second material, thereby removing said region to expose a region of the layer comprising said first material having a sufficiently fine area so as to form only a single nucleus from which said single crystal is grown, forming said nucleus by applying crystal growth treatment by the gas phase method and permitting a crystal to grow from said nucleus.

Still another object of the present invention is to provide a process for producing a solar battery, which comprises subjecting a substrate having a layer comprising a first material having higher nucleation density and a layer comprising a second material having lower nucleation density than said first material laminated thereon to application of an electrical field concentrated at a desired region of the layer comprising said second material, thereby removing said region to expose a region of the layer comprising said first material having a sufficiently fine area so as to form only a single nucleus from which said single crystal is grown, forming said nucleus by applying the crystal growth treatment by the gas phase method and permitting a crystal to grow from said nucleus, thereby forming a semiconductor layer region.

Still another object of the present invention is to provide a process for producing a solar battery, comprising the steps of:

continuously moving an electroconductive substrate within a chamber which can be reduced in pressure and forming on the surface of said substrate a layer comprising a nonnucleation surface with lower nucleation density than said substrate surface;

applying a concentrated electrical field on a desired region comprising the layer comprising the material forming said nonnucleation surface to remove said region, and exposing a region of said electroconductive substrate having a sufficiently fine area so as to form only a single nucleus from which said single crystal is grown;

applying crystal growth treatment to said electroconductive substrate to permit a crystal to grow from the nucleus formed on said exposed electroconductive substrate surface;

permitting a crystal different in electroconductivity type from the crystal grown from said nucleus to grow thereon; and forming electrodes by forming a layer comprising an electroconductive material on said crystal different in electroconductive type.

DESCRIPTION OF THE PREFERRED EMBODIMENTS

A preferred embodiment of the process for producing the substrate for selective crystal growth of the present invention is as follows.

That is, it comprises subjecting a substrate having a layer comprising a first material having higher nucleation density and a layer comprising a second material having lower nucleation density than said first material laminated thereon to the application of a concentrated electrical field at a desired region of the layer comprising said second material, thereby removing said region to expose the layer comprising said first material.

And, a preferred embodiment of the selective crystal growth process of the present invention is as follows.

That is, it comprises subjecting a substrate having a layer comprising a first material having higher nucleation density and a layer comprising a second material having lower nucleation density than said first material laminated thereon to application of a concentrated electrical field at a desired region of the layer comprising said second material, thereby removing said region to expose a region of the layer comprising said first material having a sufficiently fine area so as to form a single nucleus from which said single crystal is grown, forming said nucleus by applying the crystal growth treatment by the gas phase method and permitting a crystal to grow from said nucleus.

A preferred embodiment of the process for producing a solar battery of the present invention is as follows.

That is, it comprises subjecting a substrate having a layer comprising a first material having a higher nucleation density and a layer comprising a second material having a lower nucleation density than said first material laminated thereon to application of an electrical field concentrated at a desired region of the layer comprising said second material. The region is removed, thereby having a region of the layer comprising said first material having a sufficiently fine area so as to form only a single nucleus from which said single crystal is grown. The nucleus is formed by applying crystal growth treatment by the gas phase method and permitting a crystal to grow from said nucleus, thereby forming a semiconductor layer region.

Further, another preferred embodiment of the process for producing a solar battery of the present invention is as follows.

That is, it comprises the steps of:

continuously moving an electroconductive substrate within a chamber which can be reduced in pressure and forming on the surface of said substrate a layer comprising a nonnucleation surface with lower nucleation density than said substrate surface;

applying a concentrated electrical field on a desired region comprising the layer comprising the material forming said nonnucleation surface to remove said region, and exposing a region of said electroconductive substrate having a sufficiently fine area so as to form only a nucleus from which said single crystal is grown;

applying crystal growth treatment to said electroconductive substrate to permit a crystal to grow from the nucleus formed on said exposed electroconductive substrate surface;

permitting a crystal different in electroconductivity type from the crystal grown from said nucleus to grow thereon; and forming electrodes by forming a layer comprising an electroconductive material on said crystal different in electroconductive type.

According to the present invention as mentioned above, the substrate having a nucleation formed thereon can be produced without performing such treatments as direct resist coating, exposure, development and etching, whereby reduction of substrate production steps can be effected.

Also, according to the crystal growth process of the prior art, in which a nucleation surface is directly formed on the substrate by use of a photolithography process. A crystal is then permitted to grow, by exposing the nucleation surface after formation of, for example, $SiO_2$ on the substrate. A step of growing a crystal on the above nucleation surface by the CVD method is required to be performed separately. In contrast, by use of the present invention, for example, the step for forming $SiO_2$, the step of forming the nucleation surface, and the step of permitting a crystal to grow on the nucleation surface can be performed concurrently, and therefore efficiency of crystal growth can be enhanced as compared with the prior art process. Also, a crystal film with large grain size with the position of the grain boundary on the substrate being controlled can be formed over a large area. Further, when a solar battery is produced by use of this process, a solar battery having a large area and with good characteristics such as energy conversion efficiency, etc. can be produced, while accomplishing good production efficiency and reduced cost.

In the following, the present invention is described in more detail.

In the present invention, the material for forming the nucleation surface is a material having a higher nucleation density. The material for forming the nonnucleation surface is a material having a lower nucleation density. The nonnucleation surface material is, for example, an insulating material such as silicon oxide ($SiO_2$, etc.), silicon nitride ($Si_3N_4$), etc., while as the material for forming the nucleation surface, silicon (Si), gallium arsenide (GaAs), a metal, etc. can be employed. Specific examples of the metal can include W, Cr, Mo, Ni and others. As the crystal to be grown, there are, for example, silicon, gallium arsenide and indium phosphide (InP), etc. In choosing the material for forming the nonnucleation surface and the material for forming the nucleation surface, it is required that a material with lower electrical conductivity than the material for constituting the nucleation surface should be used for the material for forming the nonnucleation surface. Also, the nucleation surface can be also formed by coating of a material for forming the nucleation surface on a subbing material which is different from the material for forming the nucleation surface.

In the present invention, the layer of the material for forming the nonnucleation surface is subjected to dielectric breakdown to remove the portion applied with a high electrical field, thereby forming the nucleation surface. More specifically, an electrical contact point for effecting dielectric breakdown of the layer of the material for forming the nonnucleation surface is brought into contact with a desired position on the nonnucleation surface to apply a voltage, thereby concentrating the electrical field at the above electorial contact point region. The applied voltage should be preferably a voltage which is greater than 50% but less than 100% of the dielectric breakdown strength, more preferably more than 70% but less than 99% of the dielectric breakdown strength, for removal of the high electrical field applied portion. If the applied voltage is a voltage lower than 50% of the dielectric breakdown strength, the yield of the nucleation surface formation will be lowered. On the contrary, with a voltage of 100% or higher, dielectric breakdown may also occur at the regions other than the desired region.

As the shape of the electrical contact point, for example, columnar shapes such as cylinder, polygonal column, etc., or various shapes such as cone, polygonal cone, needle, etc. can be used.

The contact area between the above electrical contact point and the layer of the material forming the nonnucleation surface should be desirably 1 $\mu m^2$ or more and 16 $\mu m^2$ or less for effecting efficient electrical field concentration and also forming a sufficiently fine nucleation surface so as to form only a nucleus from which a single crystal is grown. This is because, if it is less than 1 $\mu m^2$, good electrical contact sometimes may not be obtained, while if it exceeds 16 $\mu m^2$, a plurality of crystal forming nuclei may be sometimes formed within one nucleation surface.

The interval between the electrical contact points when a plurality of electrical contact points are brought into contact with the layer of the material for forming the nonnucleation surface should be preferably more than 40 $\mu m$ but less than 100 $\mu m$ for the solar battery to be formed to have sufficiently large light receiving area.

The electrical field is applied on a desired region from a power source by use of the electrical contact point a described above in a pattern of constant direct current, sine wave, saw tooth wave, pulse, etc.

The crystal growth treatment applied for forming a single crystal on each of the nucleation surfaces exposed on the substrate as described above may be preferably conducted by use of a gas phase method such as thermo CVD, plasma CVD, optical CVD, ion plating, etc.

Referring now to the drawings, specific examples of the present invention are to be described. However, the present invention is not limited by these examples at all.

Example—1

FIG. 1A to FIG. 1G are schematic diagrams of steps for illustration of the present invention.

(i) (Formation of nucleation surface)

Figure 1A:
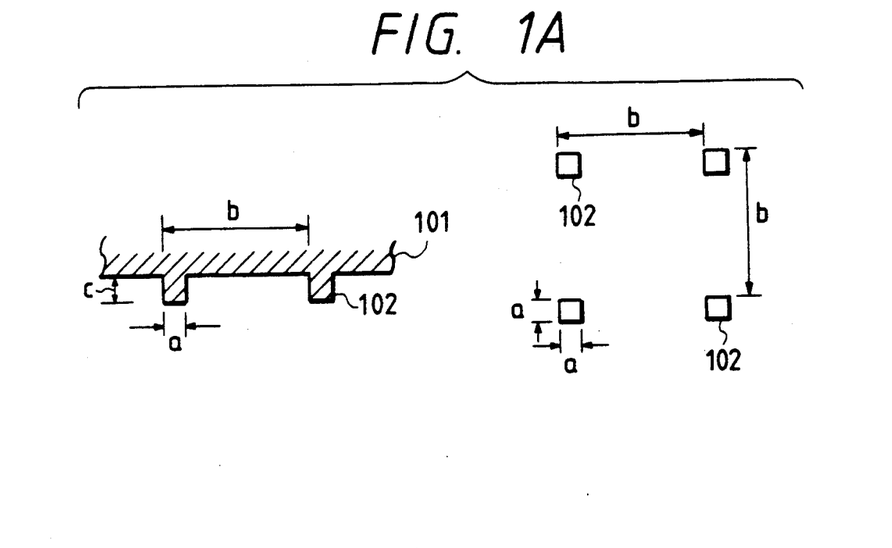
FIG. 1A to FIG. 1G are schematic diagrams of steps illustrating the present invention.

Initially, on one surface of a stainless steel plate 101 having a thickness of 0.2 mm resist was applied for etching by use of a photolithographic method. By this method, an arrangement of square shaped columnar projected structures 102, serving as electrical contact points, with a dimension of one side of a=4 μm, and a depth of c=5 μm, was formed at an interval of b=100 μm. FIG. 1A shows a sectional view and a bottom view.

Figure 1B:
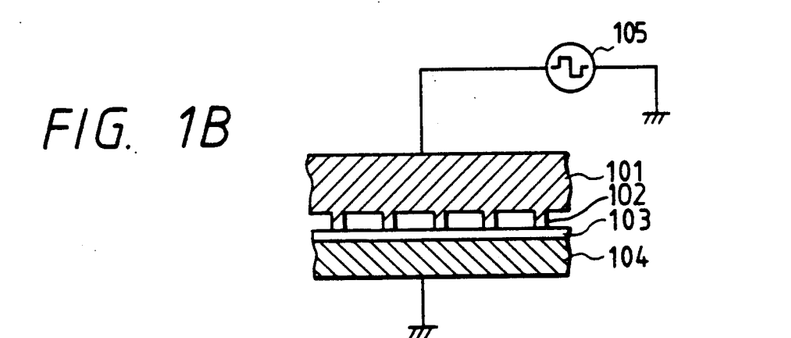

Separately from this, a stainless steel substrate 104 as the material for forming the nucleation surface was prepared, and on the surface of said substrate was deposited a $SiO_2$ layer 103 which is the material for forming the nonnucleation surface according to the conventional normal pressure CVD method. Specifically, $SiO_2$ was deposited at a substrate temperature of 450° C. to a film thickness of about 200 Å. Next, the above substrate 104 was superposed on the $SiO_2$ layer 103 so that the above columnar structure 102 was in contact therewith (FIG. 1B).

Figure 1C:
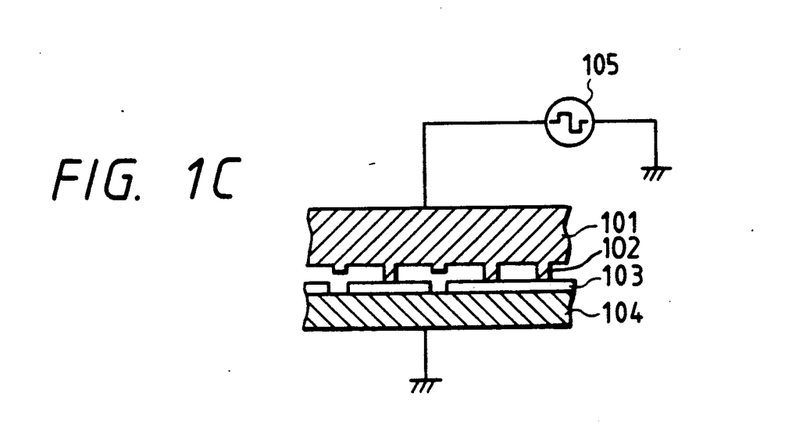

Then, by applying a pulse voltage of 15 V between the stainless steel plate 101 and the substrate 104 from the power source 105, a highly concentrated electrical field was applied through the columnar structure 102 on the $SiO_2$ layer 103 at the portion in contact with the above structure to generate dielectric breakdown (FIG. 1C). By setting the momentary maximum voltage of the pulse voltage so that an electrical field somewhat lower than the electrical field which causes dielectric breakdown of the $SiO_2$ layer 103 to occur, the electrical field was concentrated on the fine columnar projection structure 102. For this reason, the electrical field intensity between this portion (102) and the substrate 104 becomes substantially higher than the dielectric breakdown strength of the $SiO_2$ layer 103, whereby only the $SiO_2$ layer at the portion sandwiched between the columnar structure 102 and the substrate 104 underwent removal by dielectric breakdown. Here, since the $SiO_2$ layer is very thin, $SiO_2$ may be considered to be sublimated as SiO. Thus, the surface of the stainless steel substrate 104 present as a subbing layer was partially exposed, whereby the nucleation surface was formed. Since the dielectric breakdown strength of $SiO_2$ is about $10^7$ V/cm and the film thickness of the $SiO_2$ layer 103 is 200 Å, the application voltage was set at 15 V, a voltage corresponding to 75% of the dielectric breakdown strength of the $SiO_2$ layer 103.

Immediately after portions of the $SiO_2$ layer are removed by the occurrence of dielectric breakdown at the portions corresponding to a fraction of the plurality of columnar projection structures 102, since excessive current passes through the short circuit between the columnar projection structures 102 and the stainless steel substrate 104 at the said portions because the columnar projection structure is of small area, heat generation occurs locally and said columnar projection is quickly melted. Therefore, until dielectric breakdown occurs again at some place, the pulse voltage will be applied evenly at all the portions of the $SiO_2$ layer 103 sandwiched between the columnar projection structure 102 and the substrate 104.

In this example, the pulse voltage applied was ±15 V and the frequency 4 Hz. And, when the change with passage of time of the ratio of the number of nucleation surfaces formed after application of the voltage corresponding to the above columnar projection structure was examined, it was found to be about 40% after 5 minutes, and approximately 100% after 13 minutes.

Figure 1D:
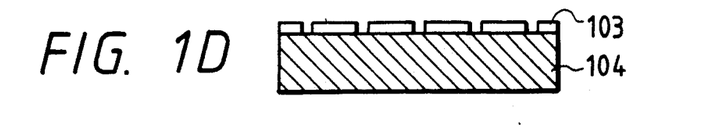

FIG. 1D shows the substrate having the $SiO_2$ formed as described above as the nonnucleation surface and the stainless steel surface as the nucleation surface. The ratio of the nucleation density of the nucleation surface to the nucleation density of the nonnucleation surface in said substrate was found to be about $10^3$.

For the material of the plate 101, a metal other than stainless steel may be employed as a matter of course. For example, Mo, Cr, W, Ni, etc. may be included, and also an electroconductive sheet can be used.

(ii) (Selective single crystal growth)

Next, by use of the substrate in FIG. 1D obtained as described above, selective single crystal growth of Si was performed as described below.

Figure 1E:
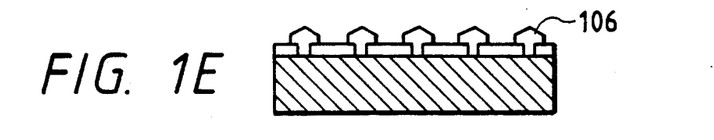
Figure 1F:
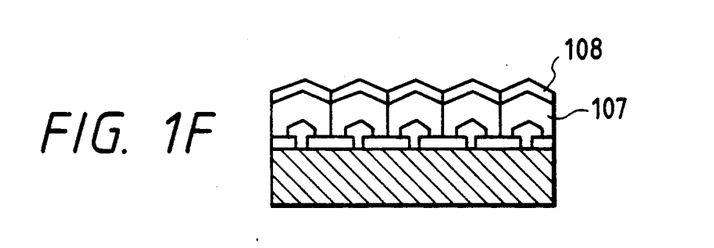

As the film forming device, a conventional thermo CVD device was used. As the starting material gas, $SiH_2Cl_2$ was employed, HCl as the etching gas, $H_2$ as the carrier gas, $PH_3$ as the material containing the element of the group V of the periodic table and $B_2H_6$ as the material containing the element of the group III of the periodic table as the doping gases. First, after the p+ single crystal Si layer 106 with a grain size of about 10 μm was grown as shown in FIG. 1E, p− Si layer 107 was permitted to grow on the p+ single crystal Si layer 106 until the grain size became about 100 μm and adjoining single crystals contact each other to form grain boundaries as shown in FIG. 1F. Subsequently, an n+ Si layer 108 with a thickness of 0.5 μm was grown on the p− Si layer 107. The formation conditions of these semiconductor layers are shown below in Table 1.

TABLE 1

|  | p+Si layer (106) | p−Si layer (107) | n+ layer (108) |
| --- | --- | --- | --- |
| $SiH_2Cl_2$ (l/min) | 1.0 | 1.2 | 1.2 |
| HCl (l/min) | 1.6 | 1.6 | 1.6 |
| $H_2$ (l/min) | 100 | 100 | 100 |
| $PH_3$/$SiH_2Cl_2$ (ppm) | 0 | 0 | 6000 |
| $B_2H_6$/$SiH_2Cl_2$ (ppm) | 4000 | 20 | 0 |
| Substrate temperature (°C.) | 920 | 920 | 900 |
| Reaction pressure (Torr) | 150 | 150 | 150 |

When the single crystals grown as described above were observed by an optical microscope, they were found to be regularly arranged in a lattice, whereby it was confirmed that the crystal growth had occurred following the arrangement pattern of the columnar structure 102 formed in the step shown above in FIG. 1A.

Figure 1G:
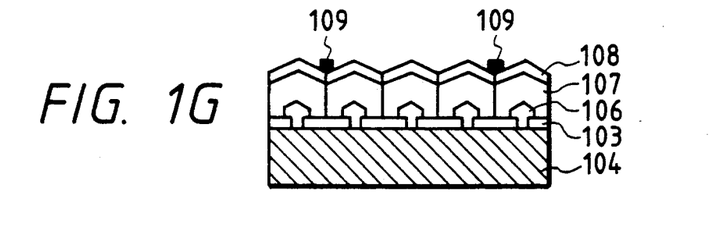

Next, as shown in FIG. 1G, a grid electrode 109 comprising Ag was formed by vacuum vapor deposition.

When the solar battery with a cell area of 1.3 cm² obtained as described above was evaluated for its characteristics by use of an AM-1.5 solar simulator, the open circuit voltage was 0.57 V, the short circuit photocurrent 29.5 mA/cm², the curve factor 0.80, and a high value of 13.5% of energy conversion efficiency was obtained. This is a higher conversion efficiency as compared with the prior art amorphous silicon solar battery with large area and low cost.

Also, when characteristics were evaluated similarly for the solar battery obtained by adding the step of forming an ITO transparent electroconductive film with a thickness of about 1000 Å by electron beam vapor deposition before formation of the grid electrode 109 as described above, the surface reflection was reduced and the short circuit photocurrent increased, with the energy conversion efficiency being improved to 14.8%.

Example—2

Figure 2:
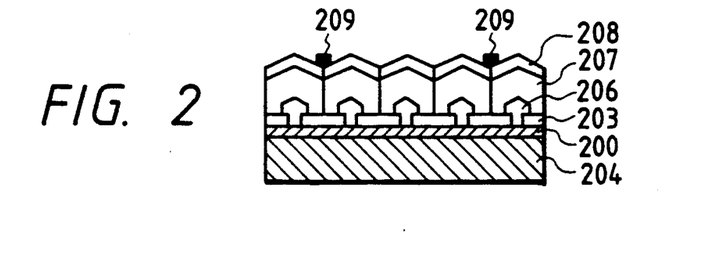
FIG. 2 is a schematic illustration showing the solar battery prepared by the present invention.

A solar battery shown in FIG. 2 was prepared according to steps similar to Example 1 as described above.

(i) (Formation of nucleation surface)

First, similarly as in the Example described above, an arrangement of a columnar projection structure of a=3 μm, b=50 μm and c=5 μm was formed on a stainless steel plate.

Separately from this, on the surface of a stainless steel substrate 204 AuGe layer 200 was formed with a thickness of 2000 Å by a conventional sputtering method. The AuGe layer is used as the material for forming the nucleation surface. Next, on the AuGe layer surface was deposited a 150 Å thick $Si_3N_4$ layer 203, which is the material for forming the nonnucleation surface, according to the conventional reduced pressure CVD method. Subsequently, similarly as described above in Example 1, the nucleation surface was formed with a pulse voltage of ±12 V and a frequency of 5 Hz. During formation, the ratio of the number of the nucleation surfaces formed after pulse voltage application corresponding to the above columnar projection structures with passage of time was examined, and it was found that it became approximately 100% after 10 minutes.

(ii) (Selective single crystal growth)

Next, by use of the substrate as described above, the selective single crystal growth of GaAs was performed as described below.

As the film forming device, a conventional MOCVD device (metal organic CVD) device was employed. As the starting material gases, trimethylgallium (TMG) and arsine ($AsH_3$) were employed, $H_2$ as the carrier gas, selenium hydride ($H_2Se$), and dimethyl zinc (DMZn) as the doping gases. First, after growth of an $n^+$ GaAs layer 206 with a grain size of about 5 μm, an $n^-$ GaAs layer 207 was grown on the $n^+$ GaAs layer 206 until the grain size became about 50 μm and the adjoining single crystals contacted each other to form grain boundaries. Subsequently, a $p^+$ GaAs layer 208 with a thickness of 0.1 μm was grown on the $n^-$ GaAs layer 207. The formation conditions of these semiconductor layers are shown below in Table 2.

TABLE 2

|  | $n^+$GaAs layer (206) | $n^-$GaAs layer (207) | $p^+$GaAs layer (208) |
| --- | --- | --- | --- |
| TMG ($10^{-5}$ mole/min) | 3 | 3 | 3 |
| $AsH_3$ ($10^{-4}$ mole/min) | 1.8 | 1.8 | 1.8 |
| $H_2$ (l/min) | 3.0 | 3.0 | 3.0 |

TABLE 2-continued

|  | $n^+$GaAs layer (206) | $n^-$GaAs layer (207) | $p^+$GaAs layer (208) |
| --- | --- | --- | --- |
| $H_2Se$ ($10^{-9}$ mole/min) | 200 | 3 | 0 |
| DMZn ($10^{-6}$ mole/min) | 0 | 0 | 1.5 |
| Substrate temperature (°C.) | 700 | 700 | 700 |
| Reaction pressure (Torr) | 75 | 75 | 75 |

Next, a grid electrode 209 comprising Ag was formed by vacuum vapor deposition.

When the solar battery with a cell area of 1.0 cm² obtained as described above was evaluated for its characteristics by use of an AM-1.5 solar simulator, the open voltage was 0.72 V, the short circuit photocurrent 20.5 mA/cm², the curve factor 0.82, and a high value of 12.1% of energy conversion efficiency was obtained. This is a very high conversion efficiency for a GaAs solar battery not having a p-GaAlAs window layer.

Example—3

Figure 3:
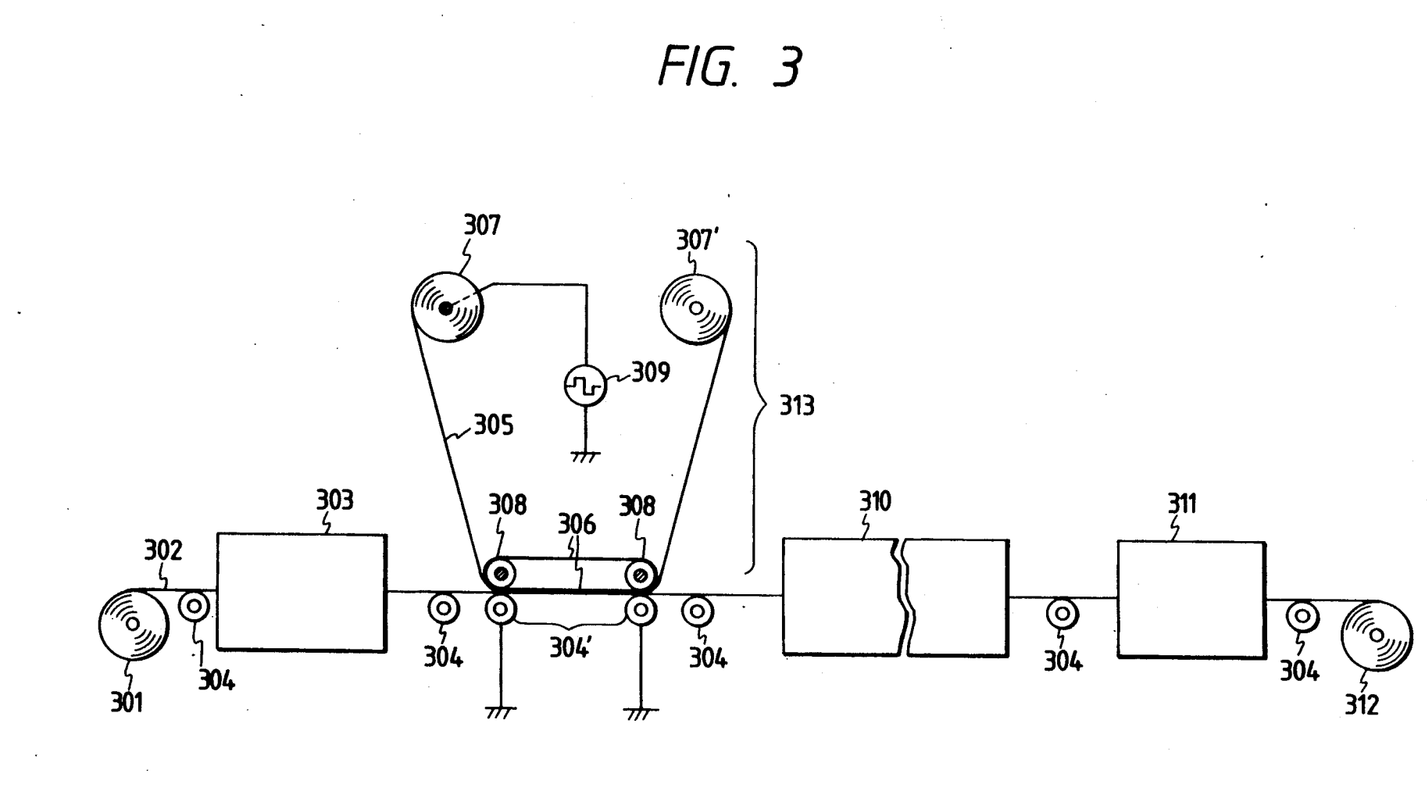
FIG. 3 is a schematic illustration showing an example of the device for preparing the solar battery to be used for practicing the present invention.

FIG. 3 is an illustration showing schematically an example of the device for preparing a solar battery which can be used for practice of the present invention and can perform formation of the nucleation surface onto a substrate web and growth of a crystal onto the nucleation surface concurrently and continuously.

The respective constituent parts of the preparation device for solar battery shown in FIG. 3 are provided within a chamber (not shown) which can be reduced in pressure.

In FIG. 3, the web 302 of, for example, a stainless steel with a thickness of 0.2 mm is fed from the delivery roller 301, and first enters the normal pressure CVD device 303. In said device, $SiO_2$ is deposited to a thickness of, for example, about 200 Å on one surface of the web 302.

Elements 304, 304' are guide rollers.

The web 302 coming out from the above CVD device 303 enters the nucleation surface forming device 313. The nucleation surface forming device 313 supplies web 305 of a stainless steel with a columnar projection structure previously formed thereon in a desired pattern on one surface from the delivery roller 307 at a speed equal to the web 302, and the columnar projection structure is brought into contact with said web 302 between the two guide rollers 304'. The web 305 is pressed against the web 302 by the rubber belt 306 wound around the two pressure rollers 308. The web 305 is supplied with a pulse voltage of desired potential and frequency from the pulse power source 309 to which a controller (not shown) is connected. 307' is the take up roller of the web 305.

After the nucleation surface is formed in a desired pattern by the above nucleation surface forming device 313, the web 302 enters the reduced pressure CVD device 310. The CVD device is divided into three chambers which are continuous through the gas gate not shown, and in the respective chambers are successively formed, for example, the $p^+$ Si layer, the $p^-$ Si layer and the $n^+$ Si layer.

The web 302 exiting the above reduced pressure CVD device 310 enters the upper electrode forming device 311. The electrode forming device forms an upper electrode from, for example, Ag paste by use of a mask pattern, and can dry the electrode by means of a heater.

The web having the upper electrode formed in the above upper electrode forming device 311 and exiting the electrode forming device is wound up on the take up roller 312.

A solar battery with the structure as described above in Example 1 was prepared by use of the device as described above. In this case, by use of a web 302 made of a stainless steel with a thickness of 0.2 mm and a width of 30 cm, the web could be fed at a speed of 20 cm/min. When the characteristics of the solar battery prepared were evaluated (sampling cell area 1.5 cm$^2$), an energy conversion efficiency of 11.7% was obtained, with variance in the web width direction being small (within ±8%).

Therefore, according to the process of the present invention, it has been found that a solar battery with high energy conversion efficiency can be produced at low cost.

As described above, according to the present invention, a substrate having nucleation surface formed thereon can be produced without performing such treatments as direct resist coating, exposure, development, etching, etc., whereby reduction of the production steps can be effected. Also, as contrasted with the crystal growth method of the prior art involving formation of a nucleation surface on a substrate by photolithography, wherein the step of exposing the nucleation surface after formation of, for example, SiO$_2$ on a substrate and the step of growing crystals on the nucleation surface by the CVD method are required to be performed separately, by use of the present invention, the SiO$_2$ formation step, the nucleation step, and the crystal growth step on the nucleation surface can be done concurrently, whereby the efficiency of crystal growth can be enhanced as compared with the prior art. Also, a crystal film with large grain size having controlled locations of grain boundaries can be formed with large area. Further, when a solar battery is produced by use of this process, a solar battery having large area and good characteristics such as energy conversion efficiency, etc. can be produced, while accomplishing good production efficiency and reduced cost.

What is claimed is:

1. A process for producing a substrate for selective crystal growth, which comprises subjecting a substrate having a layer comprising a first material having a higher nucleation density and a layer comprising a second material comprising an insulating material having a lower nucleation density than said first material laminated thereon to application of an electrical field concentrated at a desired region of the layer comprising said second material, thereby removing said region and exposing the layer comprising said first material.

2. A process for producing a substrate for selective crystal growth according to claim 1, wherein said first material comprises an electroconductive material.

3. A process for producing a substrate for selective crystal growth according to claim 1, wherein a plurality of the exposed regions of the layer comprising said first material are formed.

4. A process for producing a substrate for selective crystal growth according to claim 1, wherein application of said electrical field comprises application of a voltage which is greater than 50% but less than 100% of the dielectric breakdown strength of the layer comprising said second material.

5. A process for producing a substrate for selective crystal growth according to claim 1, wherein application of said electrical field is effected between said substrate and an electrical contact point.

6. A process for producing a substrate for selective crystal growth according to claim 5, wherein said electrical contact point has a columnar shape.

7. A process for selective crystal growth, which comprises subjecting a substrate having a layer comprising a first material having a higher nucleation density and a layer comprising a second material comprising an insulating layer having a lower nucleation density than said first material laminated thereon to application of an electrical field concentrated at a desired region of the layer comprising said second material, thereby removing said region and an exposing a region of the layer comprising said first material having a sufficiently small area so as to form only a single nucleus from which a single crystal is to be grown, forming said nucleus by crystal growth from the gas phase and growing a single crystal from said nucleus.

8. A process for selective crystal growth according to claim 7, wherein said first material comprises an electroconductive material.

9. A process for selective crystal growth according to claim 7, wherein a plurality of exposed regions of the layer comprising said first material are formed.

10. A process for selective crystal growth according to claim 7, wherein application of said electrical field comprises application of a voltage which is greater than 50% but less than 100% of the dielectric breakdown strength of the layer comprising said second material.

11. A process for selective crystal growth according to claim 7, wherein application of said electrical field is effected between said substrate and an electrical contact point.

12. A process for selective crystal growth according to claim 11, wherein said electrical contact point has a columnar shape.

13. A process for producing a solar battery, which comprises subjecting a substrate having a layer comprising a first material having a higher nucleation density and a layer comprising a second material comprising an insulating material having a lower nucleation density than said first material laminated thereon to application of an electrical field concentrated at a desired region of the layer comprising said second material, thereby moving said region and exposing a region of the layer comprising said first material having a sufficiently small area so as to form only a single nucleus from which a single crystal is to be grown, forming said nucleus by crystal growth from the gas phase and growing a single crystal from said nucleus, thereby forming a semiconductor layer.

14. A process for producing a solar battery according to claim 13, wherein said first material comprises an electroconductive material.

15. A process for producing a solar battery according to claim 13, wherein a plurality of the exposed regions of the layer comprising said first layer are formed.

16. A process for producing a solar battery according to claim 13, wherein application of said electrical field comprises application of a voltage which is greater than 50% but less than 100% of the dielectric breakdown strength of the layer comprising said second material.

17. A process for producing a solar battery according to claim 13, wherein application of said electrical field is effected between said substrate and an electrical contact point.

18. A process for producing a solar battery according to claim 17, wherein said electrical contact point has a columnar shape.

19. A process for producing a solar battery, comprising the steps of:

continuously moving an electroconductive substrate within a chamber which can be reduced in pressure and forming on the surface of said substrate a layer of an insulating material comprising a nonnucleation surface having a lower nucleation density than said substrate surface;

applying an electrical field concentrated on a desired region comprising the layer comprising the insulating material forming said nonnucleation surface to remove said region, thereby exposing a region of said electroconductive substrate having a sufficiently small area so as to form only a single nucleus from which a single crystal is to be grown;

applying crystal growth treatment to said electroconductive substrate to grow a single crystal from the nucleus formed on said exposed electroconductive substrate surface;

growing thereon a crystal opposite in conductivity type from the crystal growth from said nucleus; and forming electrodes comprising a layer of an electroconductive material on said crystal of opposite conductivity type.

20. A process for producing a solar battery according to claim 19, wherein said electroconductive substrate is supplied from a roll of a flexible web-shaped electroconductive material.

21. A process for producing a solar battery according to claim 19, wherein the respective steps are performed within different reduced pressure chambers.

22. A process for producing a solar battery according to claim 19, wherein application of said electrical field comprises application of a voltage which is greater than 50% but less than 100% of the dielectric breakdown strength of the layer comprising said material forming said non-nucleation surface.

* * * * *

UNITED STATES PATENT AND TRADEMARK OFFICE
CERTIFICATE OF CORRECTION

PATENT NO. : 5,098,850
DATED : March 24, 1992
INVENTOR(S) : SHOJI NISHIDA, ET AL.

It is certified that error appears in the above-identified patent and that said Letters Patent is hereby corrected as shown below:

COLUMN 6

Line 54, "a" (second occurrence) should read --as--.

COLUMN 12

Line 50, "mov-" should read --remov- --.

COLUMN 14

Line 16, "the" should read --said--.

Signed and Sealed this

Seventeenth Day of August, 1993

Attest:

BRUCE LEHMAN

Attesting Officer

Commissioner of Patents and Trademarks